(12) United States Patent
Matsuno et al.

(10) Patent No.: US 11,176,973 B2
(45) Date of Patent: *Nov. 16, 2021

(54) APPARATUSES INCLUDING INPUT BUFFERS AND METHODS FOR OPERATING INPUT BUFFERS

(71) Applicant: Micron Technology, Inc., Boise, ID (US)

(72) Inventors: Hiroyuki Matsuno, Tokyo (JP); Shuichi Tsukada, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/133,480

(22) Filed: Dec. 23, 2020

(65) Prior Publication Data

US 2021/0201967 A1    Jul. 1, 2021

Related U.S. Application Data

(63) Continuation of application No. 16/276,481, filed on Feb. 14, 2019, now Pat. No. 10,878,858.

(51) Int. Cl.
*G11C 7/10* (2006.01)
*G11C 11/4091* (2006.01)
*G11C 8/18* (2006.01)
*G11C 11/4074* (2006.01)
*G11C 7/22* (2006.01)
(Continued)

(52) U.S. Cl.
CPC ............. *G11C 7/1084* (2013.01); *G11C 7/06* (2013.01); *G11C 7/106* (2013.01); *G11C 7/1039* (2013.01); *G11C 7/1063* (2013.01); *G11C 7/22* (2013.01); *G11C 8/18* (2013.01); *G11C 11/4072* (2013.01);
(Continued)

(58) Field of Classification Search
CPC .................................................... G11C 7/1084
See application file for complete search history.

(56) References Cited

U.S. PATENT DOCUMENTS 10,878,858 B2 * 12/2020 Matsuno ............. G11C 11/4072
2008/0089155 A1    4/2008 Bae
(Continued)

FOREIGN PATENT DOCUMENTS

WO      2020167431 A1    8/2020

OTHER PUBLICATIONS

ISR/WO dated May 25, 2020 for PCT Application No. PCT/US2020/014646, 12 pgs.

*Primary Examiner* — Douglas King
(74) *Attorney, Agent, or Firm* — Dorsey & Whitney LLP

(57) ABSTRACT

Apparatuses including input buffers and methods for operating input buffers are described. An example input buffer includes a plurality of input buffer circuits, each receiving input data and activated by a respective clock signal. An input buffer circuit includes a decision feedback equalizer (DFB) having adjustable capacitances and reference capacitances to set a reference level of the input buffer circuit. The capacitance of the adjustable capacitances may be set by a code. The DFB provides a capacitance of the adjustable capacitances to a first sense node and further provides a capacitance of the reference capacitances to a second sense node to set the reference level of the input buffer circuit. The input buffer circuit provides output data based on the input data and the reference level set by the DFE.

20 Claims, 4 Drawing Sheets

(51) Int. Cl.
*G11C 7/06* (2006.01)
*G11C 11/4072* (2006.01)

(52) U.S. Cl.
CPC ...... *G11C 11/4074* (2013.01); *G11C 11/4091* (2013.01)

(56) References Cited

U.S. PATENT DOCUMENTS

| | | |
|---|---|---|
| 2011/0304394 A1 | 12/2011 | Bult et al. |
| 2013/0342240 A1 | 12/2013 | Amirkhany et al. |
| 2016/0065229 A1 | 3/2016 | Kull et al. |
| 2016/0247549 A1 | 8/2016 | Takagiwa |
| 2019/0036743 A1 | 1/2019 | Dimitriu |
| 2020/0265879 A1 | 8/2020 | Matsuno et al. |

* cited by examiner

APPARATUSES INCLUDING INPUT BUFFERS AND METHODS FOR OPERATING INPUT BUFFERS

CROSS-REFERENCE TO RELATED APPLICATION(S)

This application is a continuation of U.S. patent application Ser. No. 16/276,481 filed on Feb. 14,2019. This application is incorporated by reference herein in its entirety and for all purposes.

BACKGROUND

Current low power double data rate random access memory (RAM) is expected to support data rates in excess of 4266 Mbps using 2133 MHz clock frequency. The design of the input data latches is important for achieving this performance level. Challenges include relatively low power supply levels and minuscule input signal energy. Inter-symbol interference (ISI) caused by lossy routes, reflections due to characteristic impedance discontinuities, and cross-talk between parallel signal lines, as well as clock jitter, degrade an input signal to the point that an input data latch should resolve pulses of less than 80 ps by 50 mV.

Traditional sense-amplifier latches already have difficulties operating under these conditions and show relatively poor rank margin tool (RMT) margins. An option for input data latches is to use decision feedback equalization (DFE). In typical DFE implementations, past sensing decisions are used to improve the reliability of future sensing decisions by offsetting either the input signal or the reference voltage to which the input signal is compared.

However, the amount of offset provided by the DFE may be too coarse and provide an offset that is undesirably large and cannot be scaled to provide a desirable offset.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
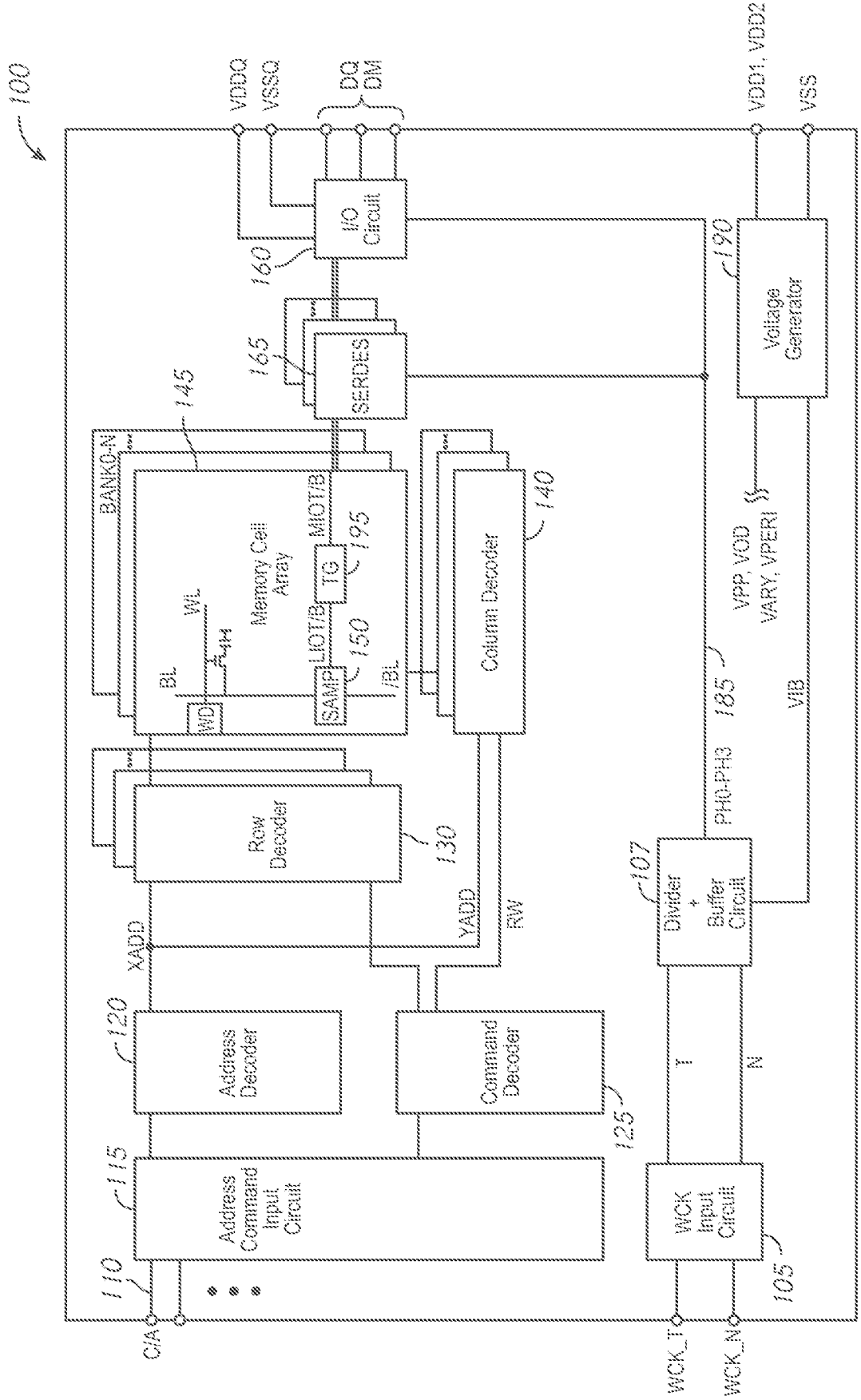
FIG. 1 is a block diagram of a semiconductor device according to an embodiment of the present disclosure.

FIG. 1 is a block diagram of a semiconductor device 100 according to an embodiment of the present disclosure. The semiconductor device 100 may include a memory cell array 145 that includes a plurality of banks 0-N. Each bank 0-N includes a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 130 and the selection of the bit line BL is performed by a corresponding column decoder 140. The plurality of sense amplifiers 150 are provided for their corresponding bit lines BL and coupled to at least one respective local I/O line LIOT/B. The local I/O line LIOT/B is further coupled to a respective one of at least two main I/O line pairs via transfer gates TG 195, which function as switches.

The address/command input circuit 115 may receive an address signal and a bank address signal from outside (e.g., via a memory controller) at the command/address terminals via the command/address bus 110 and may transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide a bank address signal BADD to the row decoder 130 and the column decoder 140.

The address/command input circuit 115 may also receive command signals and chip select signals from outside at the command/address terminals via the command/address bus 110 and may provide the command signals and the chip select signals to the command decoder 125. The command signals may include various memory commands, such as activate, read, write, etc. commands. The chip select signals select the semiconductor device 100 to respond to commands and addresses provided to the command and address terminals. The command decoder 125 may decode the command signals to generate various internal command signals. For example, the internal command signals may include a row command signal to select a word line and a column command signal to select a bit line.

When an activate command is issued with a row address, and a column address is timely supplied with the read command, read data is read from a memory cell in the memory cell array 145 designated by the row address and the column address. The read command may be received by the command decoder 125. Read/write amplifiers of the serializer/deserializer (SERDES) circuitry 165 may receive the read data and provide the read data to an input/output (I/O) circuit 160. The I/O circuit 160 may provide the read data to outside via the data terminals DQ and DM. Similarly, when the activate command is issued with a row address, and a column address is timely supplied with the write command, input buffers of the I/O circuit 160 may receive write data at the data terminals DQ, together with a data mask DM signal. The I/O circuit 160 provides the write data via the read/write amplifiers of the SERDES circuitry 165 to the memory cell array 145. Thus, the write data may be written in the memory cell designated by the row address and the column address.

The power supply terminals may receive power supply voltages VDD1, VDD2, and VSS. These power supply voltages VDD1, VDD2, and VSS may be supplied to a voltage generator circuit 190. The voltage generator circuit 190 may generate various internal voltages, VPP, VOD, VARY, VPERI, VIB, and the like based on the power supply voltages VDD1, VDD2, and VSS. For example, the internal voltage VIB may be generated using the VDD1 voltage. The internal voltage VIB may have a greater magnitude than the supply voltage VDD2. The internal voltage VPP is mainly used in the row decoder 130 and column decoder 140. The internal voltages VOD and VARY are mainly used in the sense amplifiers 150 included in the memory cell array 145. The internal voltage VIB (along with the power supply voltage VDD2) is used in a data clock (WCK) input circuit 105 and the divider and buffer circuit 107. The internal voltage VPERI is used in many other circuit blocks. The I/O circuit 160 may receive the power supply voltages VDDQ and VSSQ. For example, the power supply voltages VDDQ and VSSQ may be the same voltages as the power supply voltages VDD2 and VSS, respectively. However, the dedicated power supply voltages VDDQ and VSSQ may be used for the I/O circuit 160.

The clock terminals WCK_T and WCK_N may receive an external clock signal WCK_T and a complementary external clock signal WCK_N, respectively. The WCK_T and WCK_N clock signals may be supplied to a WCK input circuit 105. The WCK input circuit 105 may generate complementary internal clock signals T and N based on the WCK_T and WCK_N clock signals. The WCK input circuit 105 may provide the T and N clock signals to the divider and buffer circuit 107. The divider and buffer circuit 107 may generate phase and frequency controlled internal clock signals PH0-PH3 based on the T and N clock signals and a clock enable signal CKE (not shown in FIG. 1). In some embodiments of the disclosure, the PH0-PH3 clock signals may be phase shifted relative to one another by 90 degrees. For example, the PH0 clock signal is phased-shifted 0 degrees relative to the internal clock signal T, the PH1 clock signal is phased-shifted 90 degrees relative to the internal clock signal T, the PH2 clock signal is phased-shifted 180 degrees relative to the internal clock signal T, and the PH3 clock signal is phased-shifted 270 degrees relative to the internal clock signal T.

The divider and buffer circuit 107 may provide the PH0-PH3 clock signals to the SERDES circuitry 165 and the I/O circuit 160. The SERDES circuitry 165 may support read and write operations by deserializing write data and serializing high speed read data. For example, during a write operation, the SERDES circuitry 165 may be configured to receive serialized write data from the I/O circuit 160 and deserialize the serialized write data (e.g., make it parallel) to provide deserialized write data, and may provide the deserialized write data to memory cell array 145. Additionally, deserialized read data may be received from the memory cell array 145, and the SERDES circuitry 165 may be configured to serialize the deserialized read data to provide serialized read data, and may provide the serialized read data to the I/O circuit 160.

Figure 2:
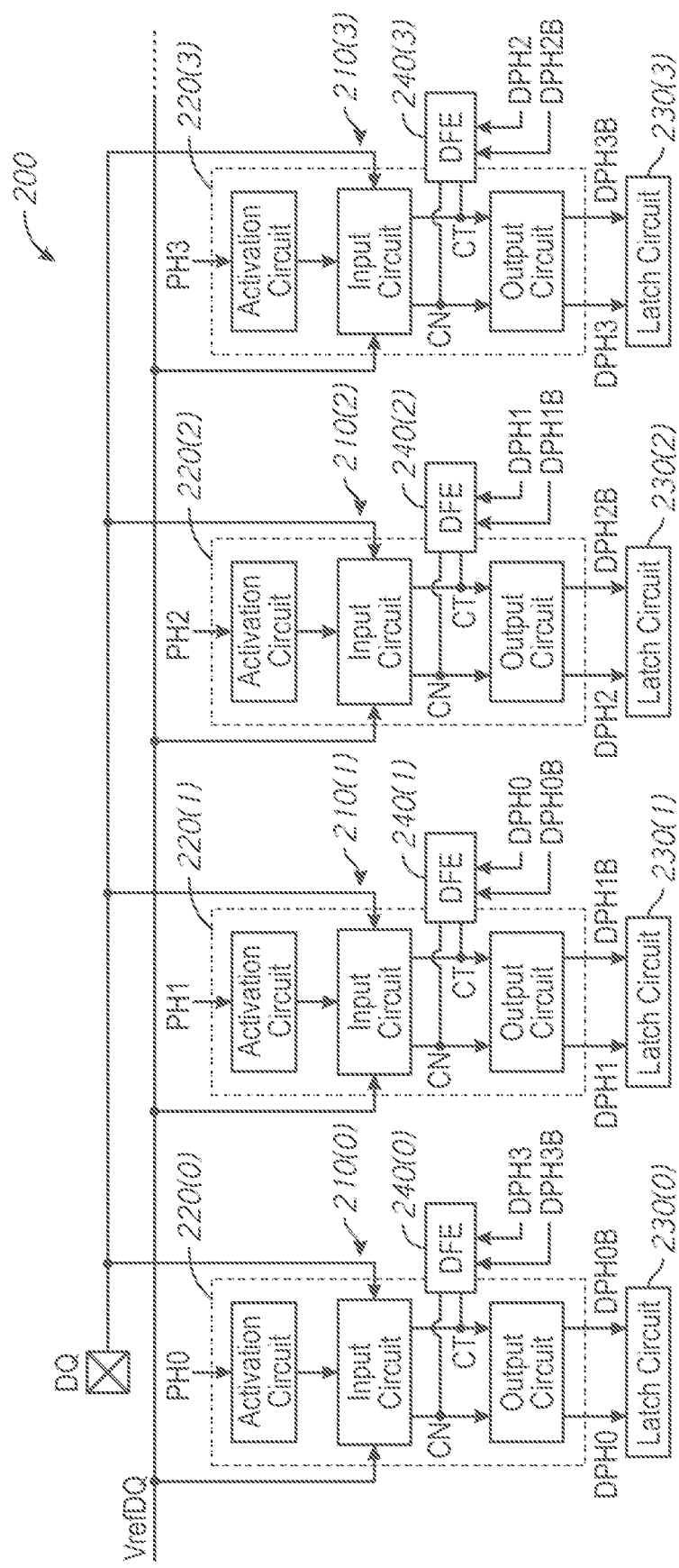
FIG. 2 is a block diagram of an input buffer according to an embodiment of the disclosure.

FIG. 2 is a block diagram of an input buffer 200 according to an embodiment of the disclosure. The input buffer 200 may be included in the input/output circuit 160 of FIG. 1 in some embodiments of the disclosure.

The input buffer 200 receives data serially provided to an external data terminal DQ and latches the data bit-by-bit over one or more clock cycles of multiphase clock signals PH0-PH3. The input buffer 200 includes input buffer circuits 210(0)-210(3) that are coupled to the external data terminal DQ and coupled to a reference voltage supply line on which a data reference voltage VrefDQ is provided. In some embodiments of the disclosure, each external data terminal DQn of a semiconductor device (e.g., semiconductor device 100 of FIG. 1) may have a corresponding input buffer, such as input buffer 200.

Each of the input buffer circuits 210(0)-210(3) is provided a respective one of the multiphase clock signals. For example, the input buffer circuit 210(0) is provided clock PH0, the input buffer circuit 210(1) is provided clock PH1, the input buffer circuit 210(2) is provided clock PH2, and the input buffer circuit 210(3) is provided clock PH3. Each of the multiphase clock signals PH0-PH3 may have a different phase from one another. For example, in some embodiments of the disclosure, the multiphase clock signals PH0-PH3 have a 90 degree phase relative to one another (e.g., "quadrature" clock signals). The PH0 clock may have a 0 degree phase, the PH1 clock may have a 90 degree phase, the PH2 clock may have a 180 degree phase, and the PH3 clock may have a 270 degree phase. Other embodiments of the disclosure may have multiphase clock signals with other relationships to one another.

The input buffer circuit 210(0) includes a sense circuit 220(0) coupled to the external data terminal DQ and the VrefDQ voltage supply line. The sense circuit 220(0) includes and activation circuit that is provided the respective multiphase clock PH0. When activated by the PH0 clock (e.g., high clock level), an input circuit of the sense circuit 220(0) senses a voltage difference between a voltage at the external data terminal DQ and the VrefDQ voltage of the voltage supply line and provides respective voltages to sense nodes CN and CT based on the voltage difference between the DQ voltage and VrefDQ voltage. For example, the input circuit compares the voltage at the external data terminal DQ with the VrefDQ voltage and provides voltages to the CN and CT nodes based on the comparison. An output circuit of the sense circuit 220(0) provides sense outputs to a latch circuit 230(0) that are based on the voltages of the CN and CT nodes and a reference level (trip point level of input buffer circuit 210) set by a decision feedback equalizer (DFE) circuit 240(0) coupled to the CN and CT nodes. The latch circuit 230(0) latches and provides output data DPH0 and DPH0B having logic levels based on the sense outputs. The output data DPH0 and DPH0B may be complementary. That is, one of the output data DPH0 and DPH0B may have a first logic level (e.g., "0" logic level) and the other output data will have a second logic level that is the opposite of the first logic level (e.g., "1" logic level), or vice versa.

The DFE circuit 240(0) is provided output data DPH(n−1) and DPH(n−1)B from another one of the input buffer circuits 210. The DFE circuit 240(0) may set a reference level for the sense circuit 220(0) based on the output data DPH(n−1) and DPH(n−1)B from the other input buffer circuit 210. For example, the DFE circuit 240(0) may set the reference level by changing (e.g., shifting) the reference level from a first reference level to a second reference level, or vice versa. The DFE circuit 240(0) may also set the reference level by maintaining the reference level from a previous reference level. The reference level set by the DFE circuit 240(0) may be relative to the reference voltage VrefDQ (e.g., higher than the reference voltage VrefDQ or lower than the reference voltage VrefDQ). In some embodiments of the disclosure, the DFE circuit 240(0) may provide capacitances to the sense nodes CN and CT to set the reference level to improve sensing accuracy of the data at the external data terminal DQ. The capacitances provided by the DFE circuit to the sense nodes CN and CT may be based on the output data DPH(n−1) and DPH(n−1)B from the other sense circuit 220.

The input buffer circuits 210(1)-210(3) are similar to the input buffer circuit 210(0), and the description for input buffer circuit 210(0) applies to the input buffer circuits 210(1)-210(3) accordingly.

In operation, the DFE circuit 240(0) sets a reference level (e.g., a high reference level or a low reference level) based on the output data DPH(n−1) and DPH(n−1)B from another sense amplifier, as previously discussed. For example, when the output data DPH(n−1) is a high logic level (e.g., a high logic level voltage) and the output data DPH(n−1)B is a low logic level (e.g., a low logic level voltage), the DFE circuit 240(0) may effectively increase the reference level for the input buffer circuit 210(0) relative to the VrefDQ voltage. In contrast, when the output data DPH(n−1) is a low logic level and the output data DPH(n−1)B is a high logic level, the DFE circuit 240(0) may decrease a voltage of the reference level for the input buffer circuit 210(0) relative to the VrefDQ voltage. Thus, the DFE circuit 240(0) sets a reference level for the input buffer circuit 210(0) based on the output data DPH(n−1) and DPH(n−1)B from the other input buffer circuit 210.

An active PH0 clock activates the input circuit of the sense circuit 220(0) to compare a voltage at the external node DQ and the VrefDQ voltage. Based on the comparison (e.g., voltage difference), the input circuit provides voltages to the sense nodes CN and CT. The sense nodes CN and CT each develop a respective voltage that is influenced by the DFE circuit 240(0). The output circuit provides sense outputs to the latch circuit 230(0) based on the voltages at the CN and CT nodes. The latch circuit 230(0) latches and provides output data DPH0 and DPH0B having respective logic levels based on the sense outputs. The latch circuit 230(0) provides output data DPH0 and DPH0B, one having the latched logic level and the other having the complementary logic level. The sense circuit 220(0) becomes inactive with an inactive PH0 clock, and the sense nodes CN and CT may be changed and outputs of the input buffer circuit 210(0) may be changed to respective an initial voltages in preparation tor a next activation (e.g., the input buffer circuit 210(0) is precharged). The sense circuit 220(0) remains inactive until a next active PH0 clock.

As previously described, each of the input buffer circuits 210(0)-210(3) receive a respective clock signal having a different phase from the clock signals provided to the other input buffer circuits 210. The sense circuits 220(0)-220(3) are activated at different phases by the PH0-PH3 clocks as a result.

Figure 3:
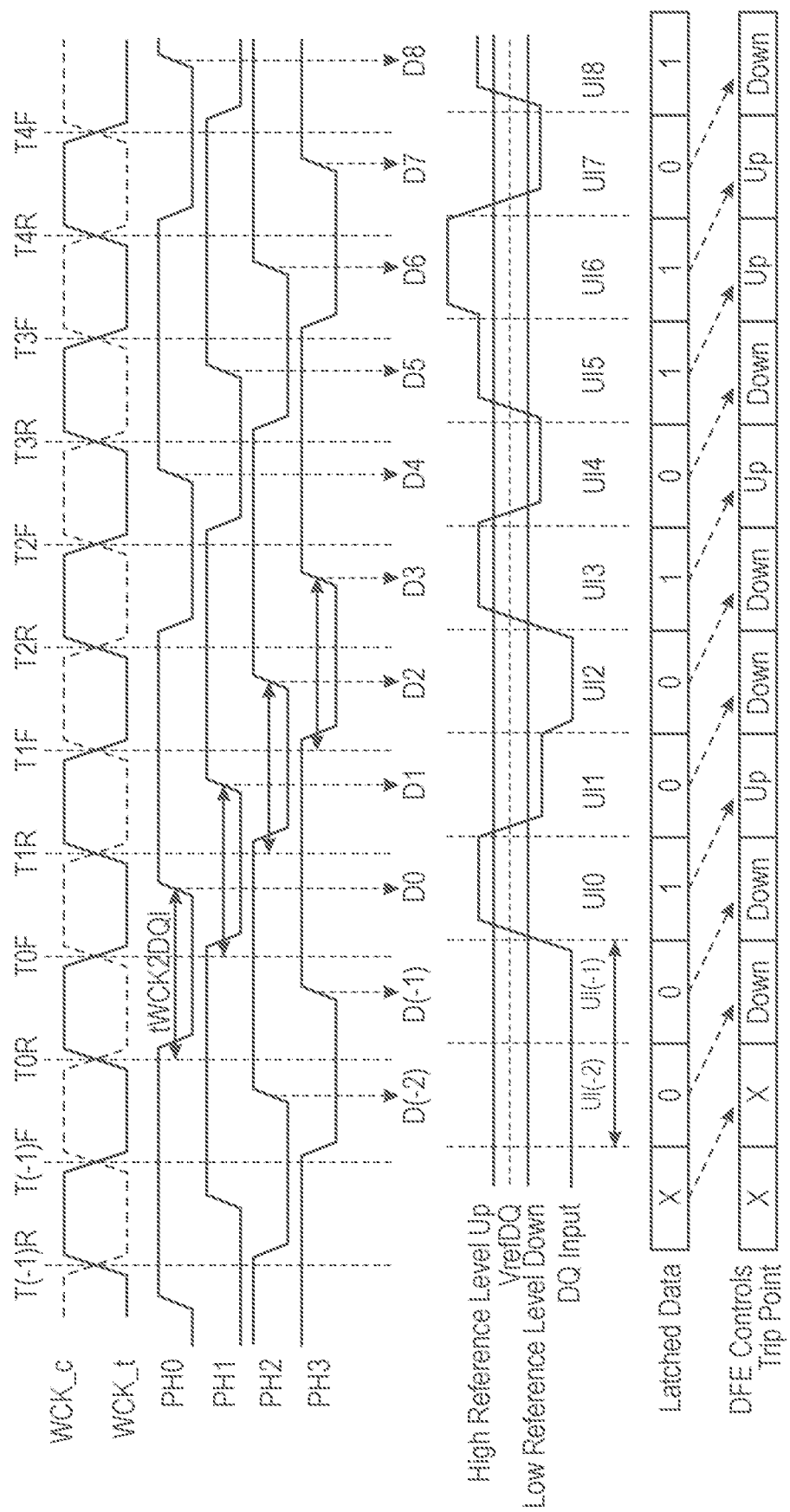
FIG. 3 is a timing diagram of various clocks and voltages during operation of an input buffer according to an embodiment of the disclosure.

FIG. 3 is a timing diagram of various clock signals and voltages during operation of a plurality of input buffers according to an embodiment of the disclosure. The example operation of FIG. 3 shows multiple bits (e.g., preamble bits D(−2) and D(−1), and data bits D0-D8) input to the input buffers. The timing diagram of FIG. 3 may show operation of an input buffer included in the input/output circuit 160 of FIG. 1 and/or the input buffer circuits 210(0)-210(3) of FIG. 2 in some embodiments of the disclosure.

FIG. 3 shows clock signals WCK_t and WCK_c, and further shows multiphase clock signals PH0, PH1, PH2, and PH3. In the example operation of FIG. 3, the multiphase clock signals PH0-PH3 have lower clock frequencies than the WCK_t and WCK_c clock signals, and have different phases from one another. For example, the multiphase clock signals PH0-PM3 have one-half the clock frequency of the WCK_t and WCK_c clock signals, and multiphase clock signals PH0-PH3 have a 90 degree phase relative to one another (e.g., PH0=0 degrees, PH1=90 degrees, PH2=180 degrees, and PH3=270 degrees).

A data reference voltage VrefDQ and a voltage of the external data terminal DQ is also shown in FIG. 3. A High Reference Level Up and a Low Reference Level Down for the input buffers are also shown in FIG. 3. As will be described, a reference level for an input buffer circuit is set to the High Reference Level Up or the Low Reference Level Down by respective DFE circuits of the input buffer.

The example operation of FIG. 3 will be described with reference to the input buffer circuits 210(0)-210(3).

Prior to time T0R, the external data terminal DQ has a same voltage for two data unit intervals (UI). Each UI in the example operation of FIG. 3 is one-half a clock period of the WCK_t and WCK_c clock signals. With reference to the voltage of the external data terminal DQ for UI(−1), a rising edge and high clock level of the PH3 clock following time T0R activates the sense circuit 220(3) of the input buffer circuit 210(3) to sense a low voltage relative to the VrefDQ voltage. The sense circuit 220(3) provides sense outputs based on the relatively lower voltage of the external data terminal DQ and the reference level set for the input buffer circuit 210(3), which causes the latch circuit 230(3) to latch a low logic level for data D(−1) and provide a low logic level voltage for DPH3 and a high logic level voltage tor DPH3B.

The low logic level of DPH3 and the high logic level of DPH3B are provided to the DFE circuit 240(0) of the input buffer circuit 210(0). The DFE circuit 220(0) sets the reference level of the input buffer circuit 210(0) based on the logic levels of DPH3 and DPH3B. For example, in the example operation of FIG. 3, based on the low logic level DPH3 and high logic level DPH3B, the DFE circuit 240(0) sets the reference level for the input buffer circuit 210(0) to the Low Reference Level Down.

Following the latching of the low logic level for data D(−1), the voltage of the external data terminal DQ changes to a higher voltage for UI0. A rising edge of the PH0 clock occurs at a time tWCK2DQI following a clock edge of the WCK_t clock at time T0R. The time tWCK2DQI may be a timing specification for a rising edge of a multiphase clock signal following a corresponding clock edge (e.g., rising edge or falling edge) of the WCK_t clock. In more detail, the time tWCK2DQI is the propagation delay time from WCK_T/WCK_N to PH0-PH3 in FIG. 1 The rising edge and high clock level of the PH0 clock activates the sense circuit 220(0) of the input buffer circuit 210(0) to sense a voltage that is greater relative to the Low Reference Level Down set by the DFE circuit 240(0). The sense circuit 220(0) provides sense outputs based on the relatively higher voltage of the external data terminal DQ and the reference level set for the input buffer circuit 210(0). As a result, the latch circuit 230(0) latches a high logic level for data D0 and provides a high logic level voltage for DPH0 and a low logic level voltage for DPH0B.

The high logic level of DPH0 and the low logic level of DPH0B is provided to the DFE circuit 220(1) of the input buffer circuit 210(1). The DFE circuit 220(1) sets the reference level of the input buffer circuit 210(1) based on the logic levels of DPH0 and DPH0B. For example, based on the high logic level DPH0 and low logic level DPH0B, the DFE circuit 240(1) sets the reference level for the input buffer circuit 210(1) to the High Reference Level Up.

Following the latching of the high logic level for data D(0), the voltage at the external data terminal DQ changes to a lower voltage for UI1. A rising edge of the PH1 clock occurs at a time tWCK2DQI following a clock edge of the WCK_t clock at time T0F. The rising edge and high clock level of the PH1 clock activates the sense circuit 220(1) of the input buffer circuit 210(1) to sense a voltage that is lower relative to the High Reference Level Up set by the DFE circuit 240(1). The sense circuit 220(1) provides sense outputs based on the relatively lower voltage of the external data terminal DQ and the reference level set for the input buffer circuit 210(1). As a result, the latch circuit 230(1) latches a low logic level for data D1 and provides a low logic level voltage for DPHI and a high logic level voltage for DPH1B.

The low logic level of DPH1 and the high logic level of DPH1B is provided to the DFE circuit 240(2) of the input buffer circuit 210(2). Based on the low logic level DPH1 and high logic level DPH1B, the DFE circuit 240(2) sets the reference level for the input buffer circuit 210(2) to the Low Reference Level Down.

Following the latching of the high logic level for data D1, the voltage at the external data terminal DQ decreases to a lower voltage for UI2. A rising edge of the PH2 clock occurs at a time tWCK2DQI following a clock edge of the WCK_t clock at time T1R. The rising edge and high clock level of the PH2 clock activates the sense circuit 220(2) of the input buffer circuit 210(2) to sense a voltage that is lower relative to the Low Reference Level Down set by the DFE circuit 240(2). The sense circuit 220(2) provides sense outputs based on the relatively lower voltage of the external data terminal DQ and the reference level set for the input buffer circuit 210(2). As a result, the latch circuit 230(2) latches a low logic level for data D2 and provides a low logic level voltage for DPH2 and a high logic level voltage for DPH2B.

The low logic level of DPH2 and the high logic level of DPH2B is provided to the DFE circuit 240(3) of the input buffer circuit 210(3). Based on the low logic level DPH2 and high logic level DPH2B, the DFE circuit 240(3) sets the reference level for the input buffer circuit 210(3) to the Low Reference Level Down.

Following the latching of the low logic level for data D(2), the voltage at the external data terminal DQ for UI2 changes to a higher voltage for UI3. A rising edge of the PH3 clock occurs at a time tWCK2DQI following a clock edge of the WCK_t clock at time T1F. The rising edge and high clock level of the PH3 clock activates the sense circuit 220(3) of the input buffer circuit 210(3) to sense a voltage that is higher relative to the Low Reference Level Down set by the DFE circuit 240(3). The sense circuit 220(3) provides sense outputs based on the relatively higher voltage of the external data terminal DQ and the reference level set for the input buffer 210(3). As a result, the latch circuit 230(3) latches a high logic level for data D3 and provides a high logic level voltage for DPH3 and a low logic level voltage for DPH3B.

The high logic level of DPH3 and the low logic level of DPH3B is provided to the DFE circuit 240(0) of the input buffer circuit 210(0). Based on the high logic level DPH3 and low logic level DPH3B, the DFE circuit 240(0) sets the reference level for the input buffer circuit 210(0) to the High Reference Level Up.

Following the latching of the four data bits D0-D3 over one clock cycle of the multiphase clock signals, additional data bits D4-D7 are latched over another clock cycle of the multiphase clock signals.

The voltage at the external data terminal DQ changes to a lower voltage for UI4. A rising edge of the PH0 clock during UI4 and the high clock level of the PH0 clock activates the sense circuit 220(0) of the input buffer circuit 210(0) to sense a voltage that is lower relative to the High Reference Level Up set by the DFE circuit 240(0). The sense circuit 220(0) provides sense outputs based on the relatively lower voltage of the external data terminal DQ and the reference level set for the input buffer circuit 210(0). As a result, the latch circuit 230(0) latches a low logic level for data D4 and provides a low logic level voltage for DPH0 and a high logic level voltage for DPH0B.

The low logic level of DPH0 and the high logic level of DPH0B is provided to the DFE circuit 240(1) of the input buffer circuit 210(1). Based on the low logic level DPH0 and high logic level DPH0B, the DFE circuit 240(1) sets the reference level for the input buffer circuit 210(1) to the Low Reference Level Down.

Following the latching of the high logic level for data D4, the voltage at the external data terminal DQ for UI4 changes to a higher voltage for UI5. A rising edge of the PHI clock during UI5 and the high clock level of the PH1 clock activates the sense circuit 220(1) of the input buffer circuit 210(1) to sense a voltage that is higher relative to the low reference level Down set by the DFE circuit 240(1). The sense circuit 220(1) provides sense outputs based on the relatively higher voltage of the external data terminal DQ and the reference level set for the input buffer circuit 210(1). As a result, the latch circuit 230(1) latches a high logic level for data D5 and provides a high logic level voltage for DPH1 and a low logic level voltage for DPH1B.

The high logic level of DPH1 and the low logic level of DPH1B is provided to the DFE circuit 240(2) of the input buffer circuit 210(2). Based on the high logic level DPH1 and low logic level DPH1B, the DFE circuit 240(2) sets the reference level for the input buffer circuit 210(2) to the high reference level Up.

Following the latching of the low logic level for data D5, the voltage at the external data terminal DQ for UI5 increases to a higher voltage for UI6. A rising edge of the PH2 clock during UI6 and the high clock level of the PH2 clock activates the sense circuit 220(2) of the input buffer circuit 210(2) to sense a voltage that is higher relative to the high reference level Up set by the DFE circuit 240(2). The sense circuit 220(2) provides sense outputs based on the relatively higher voltage of the external data terminal DQ and the reference level set for the input buffer circuit 210(2). As a result, the latch circuit 230(2) latches a high logic level for data D6 and provides a high logic level voltage for DPH2 and a low logic level voltage for DPH2B.

The high logic level of DPH2 and the low logic level of DPH2B is provided to the DFE circuit 240(3) of the input buffer circuit 210(3). Based on the high logic level DPH2 and low logic level DPH2B, the DFE circuit 240(3) sets the reference level for the input buffer circuit 210(3) to the High Reference Level Up.

Following the latching of the low logic level for data D6, the voltage at the external data terminal DQ for UI6 changes to a lower voltage for UI7. A rising edge of the PH3 clock during UI7 and the high clock level of the PH3 clock activates the sense circuit 220(3) of the input buffer circuit 210(3) to sense a voltage that is lower relative to the High Reference Level Up set by the DFE circuit 240(3). The sense circuit 220(3) provides sense outputs based on the relatively lower voltage of the external data terminal DQ and the reference level set for the input buffer circuit 210(3). As a result, the latch circuit 230(3) latches a low logic level for data D7 and provides a low logic level voltage for DPH3 and a high logic level voltage for DPH3B.

The low logic level of DPH3 and the high logic level of DPH3B is provided to the DFE circuit 240(0) of the input buffer circuit 210(0). Based on the low logic level DPH3 and high logic level DPH3B, the DFE circuit 240(0) sets the reference level for the input buffer circuit 210(0) to the Low Reference Level Down.

Data D8 is latched by the latch circuit 230(0) of the input buffer circuit 210(0) during UI8 in a manner similar to that previously discussed.

Figure 4:
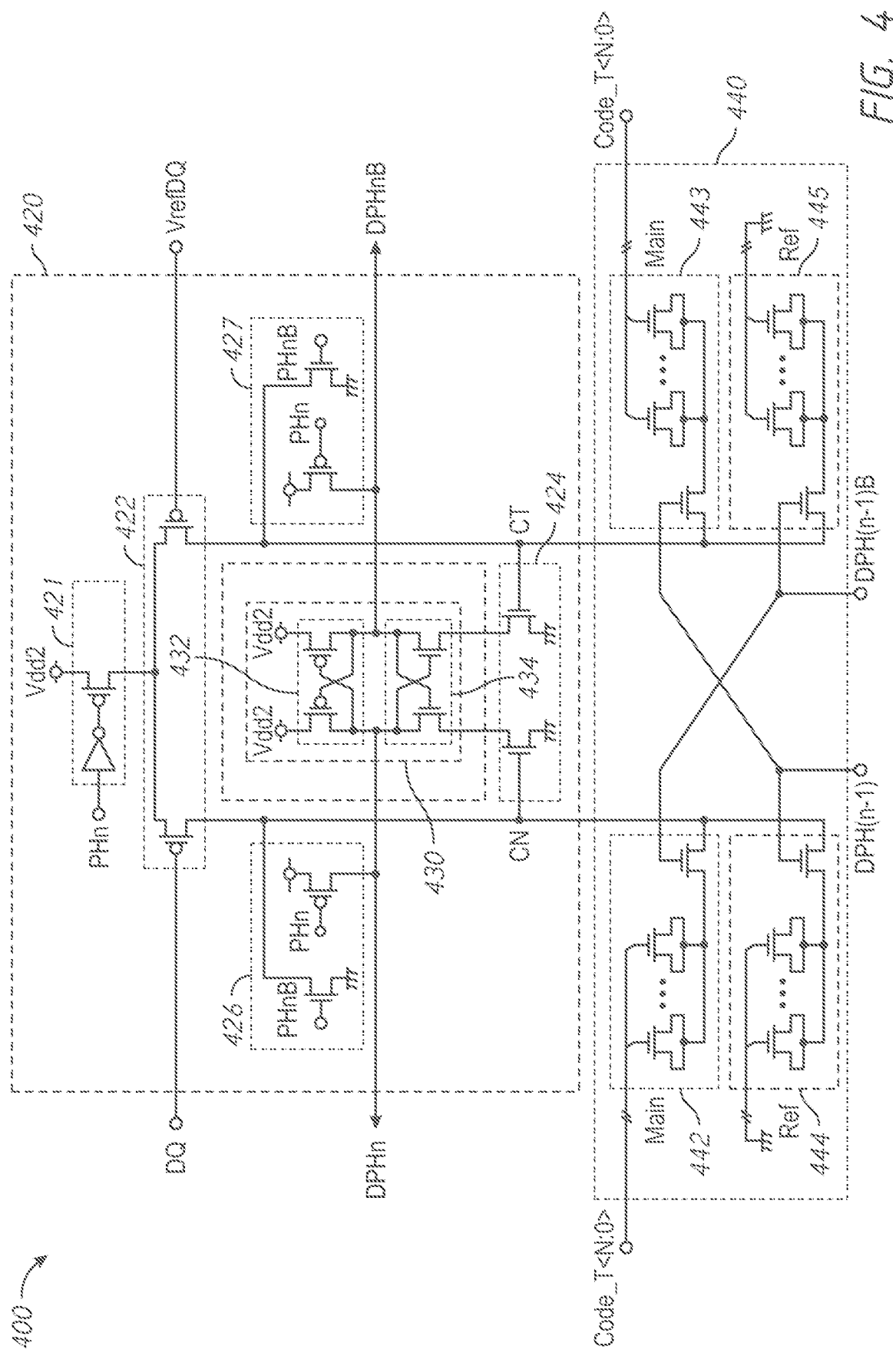
FIG. 4 is a schematic diagram of an input buffer circuit 400 according to an embodiment of the disclosure.

FIG. 4 is a schematic diagram of an input buffer circuit 400 according to an embodiment of the disclosure. The input buffer circuit 400 may be included in an input buffer including in the input/output circuit 160 of FIG. 1 and/or the input buffer 200 of FIG. 2 in some embodiments of the disclosure.

The input buffer circuit 400 includes a sense circuit 420 coupled to a latch circuit 430, and further includes a decision feedback equalizer (DFE) circuit 440.

The sense circuit 420 is provided a clock PHn (and complementary clock PHnB in some embodiments of the disclosure), and further provided a data reference voltage VrefDQ and data on an external data terminal DQ to which the input buffer circuit 400 is coupled. The PHn clock may be a clock from a plurality of multiphase clock signals, and have a phase relationship to the other clocks of the multiphase clock signals.

The sense circuit 420 includes an activation circuit 421 that provides power from a power supply (e.g., vdd2) when the PHn clock is active (e.g., a high clock level). The activation circuit 421 may include an inverter circuit and a p-channel transistor (e.g., P-type field effect transistor) coupled to the power supply as shown in FIG. 4. However, some embodiments of the disclosure may include an activation circuit 421 including alternative and/or additional circuits. Power from the activation circuit 421 is provided to the input circuit 422.

The input circuit 422 is coupled to output circuit 424 of the sense circuit 420 at sense nodes CN and CT. A first input transistor of the input circuit 422 is provided data from the external terminal DQ and a second input transistor of the input circuit 422 is provided the VrefDQ voltage. The first input transistor is coupled to a first output transistor of the output circuit 424 and the second input transistor is coupled to a second output transistor of the output circuit 424. ITe first and second input transistors of the input circuit 422 may be implemented as p-channel transistors and the first and second output transistors of the output circuit 424 may be implemented as n-channel transistors as shown in FIG. 4. However, the input circuit 422 and the output circuit 424 may be implemented using different circuits in other embodiments of the disclosure. In some embodiments of the disclosure, the p-channel transistors of the input circuit 422 may be low threshold voltage (Vt) devices (e.g., Vt in a range of 100-300 mV). The p-channel transistors of the input circuit 422 may be matched, for example, having the same circuit layout as one another. Similarly, The n-channel transistors of the output circuit 424 may be matched, for example, having the same circuit layout as one another.

When activated by the PHn clock, the input circuit 422 of the sense circuit 420 compares a voltage at the external data terminal DQ and the VrefDQ voltage and provides respective voltages to the CN and CT nodes. The output circuit 424 of the sense circuit 420 provides sense outputs having respective voltage levels basal on the voltages provided to the CN and CT nodes and the reference level set by the DFE circuit 440.

The sense circuit 420 further includes precharge circuits 426 and 427. The precharge circuit 426 is coupled to the sense node CN and to a first output at which output data DPHn is provided. The precharge circuit 427 is coupled to the sense node CT and to a second output at which output data DPHnB is provided. FIG. 4 shows an embodiment of the disclosure where the precharge circuits 426 and 427 may each include a p-channel transistor to precharge the respective output and further include an n-channel transistor to precharge the sense node CN/CT. Other embodiments of the disclosure may have precharge circuits including different circuits. The precharge circuits 426 and 427 precharge the sense nodes CN and CT, and precharge the outputs to initial voltages when the PHn clock, is inactive (e.g., a low clock level). For example, the precharge circuits 426 and 427 may provide a first precharge voltage to sense nodes CN and CT and may provide a second precharge voltage to the first and second outputs. In some embodiments of the disclosure, the first precharge voltage may be a reference voltage, such as ground, and the second precharge voltage may be a power supply voltage, such as vdd2.

The latch circuit 430 includes cross-coupled p-channel transistors 432 and cross-coupled n-channel transistors 434 that are coupled to the first and second outputs at which output data DPHn and DPHnB are provided. The cross-coupled p-channel transistors 432 are provided power from a power supply (e.g., vdd2) and the cross-coupled n-channel transistors 434 are coupled to the output circuits 424. The latch circuit 430 latches and provides the output data DPHn and DPHnB having logic levels based on the sense outputs from the sense circuit 420. The p-channel transistors may be matched to one another and the n-channel transistors may be matched to one another. For example, in some embodiments of the disclosure, the p-channel transistors and/or n-channel transistors have the same circuit layout as one another.

The DFE circuit 440 is coupled to the sense nodes CN and CT, and includes adjustable capacitance 442 coupled to sense node CN and adjustable capacitance 443 coupled to sense node CT. The DFE circuit 440 further includes reference capacitance 444 coupled to sense node CN and reference capacitance 445 coupled to sense node CT. When the data DPH(n−1)B is a high logic level, a capacitance of the adjustable capacitance 442 is provided to sense node CN and a capacitance of the reference capacitance 445 is provided to sense node CP. When the data DPH(n−1) is a high logic level, a capacitance of the adjustable capacitance 443 is provided to sense node CT and a capacitance of the reference capacitance 444 is provided to sense node CR.

The data DPH(n−1) and DPH(n−1)B are data from another input buffer circuit. For example, in some embodiments of the disclosure, the data DPH(n−1)and DPH(n−1)B are provided by an input buffer circuit that is activated by a clock PH(n−1)having an earlier phase than the PHn clock, where both clocks are included in a set of multiphase clock signals. For example, for quadrature multiphase clock signals, and where the input buffer circuit 400 is activated by a 0 degree clock, the data DPH(n−1) and DPH(n−1)B are provided by an input buffer circuit that is activated by a 270 degree clock. In another example, where the input buffer circuit 400 is activated by a 90 degree clock, the data DPH(n−1)and DPH(n−1)B are provided by an input buffer circuit that is activated by a 0 degree clock.

The adjustable capacitance 442 provides a capacitance that may be set by a DFE code Code_T<N:0>. The Code_T<N:0> code may be a value programmed in a mode register (not shown). The Code_T<N:0> may be provided to the adjustable capacitance 442 to set the capacitance. The Code_T<N:0> code may include one or more bits, where N is an integer greater than or equal to zero. Changing the Code_T<N:0> code changes the capacitance provided by the adjustable capacitance 442. For example, FIG. 4 shows an embodiment of the disclosure where the adjustable capacitance 442 includes a plurality of capacitors. Each of the plurality of capacitors may be provided a respective bit of the Code_T<N:0> code. A capacitor provided a high logic bit provides a higher capacitance than when provided a low logic bit. As the number of capacitors having a higher capacitance change (e.g., changing the value of Code_T<N:0>), the capacitance of the adjustable capacitance 442 changes. The capacitance of the adjustable capacitance may range from a minimum capacitance when the Code_T<N:0> code includes all "0" bits to a maximum capacitance when the Code_T<N:0> code includes all "1" bits. When a switch of the adjustable capacitance 442 is activated by high logic level data DPH(n−1)B, the switch is conductive and the plurality of capacitors provide a capacitance to the sense node CN. Thus, the capacitance provided by the adjustable capacitance 442 maybe adjusted by changing the value of the Code_T<N:0> code.

In some embodiments of the disclosure, each of the plurality of capacitors is provided by a field effect transistor (FET) capacitor with gates receiving a respective bit of the Code_T<N:0> code. In some embodiments of the disclosure, each of the plurality of capacitors of the adjustable capacitance provide a same capacitance when activated and a same capacitance when not activated. In some embodiments of the disclosure, each of the plurality of capacitors of the adjustable capacitance provide a different capacitance. For example, each of the capacitors may be a different size, which provides different capacitances. The sizes of the capacitors may be binary weighted (e.g., 1, 2, 4, 8, etc.) in some embodiments of the disclosure.

The adjustable capacitance 443 also provides a capacitance that may be adjusted by the DFE code Code_T<N:0>. The adjustaole capacitance 443 provides a capacitance to the sense node CT when the data DPH(n−1) is a high logic level. The adjustable capacitance 443 may have a similar structure as previous described for the adjustable capacitance 442.

The reference capacitance 444 provides a capacitance to the sense node CN when the data DPH(n−1) is a high logic level. FIG. 4 shows an embodiment of the disclosure where the reference capacitance 444 includes a plurality of capacitors and a switch. When the switch is activated by high logic level data DPH(n−1), the switch is conductive and the plurality of capacitors provide a capacitance to the sense node CN. In some embodiments of the disclosure, when the data DPH(n−1) is a high logic level, the reference capacitance 444 provides a same capacitance as the minimum capacitance of the adjustable capacitance 443. For example, in some embodiments of the disclosure, each of the plurality of capacitors of the reference capacitance 444 is matched to a capacitor included in the adjustable capacitance 443 (e.g., each of the plurality of capacitors of the reference capacitance 444 has the same electrical characteristics as a corresponding capacitor of the adjustable capacitance 443 receiving a "0" bit). In matching the capacitance of the adjustable capacitance 443, the reference capacitance 444 may include capacitors having a similar structure as the capacitors of the adjustable capacitances. For example, where the adjustable capacitance 443 includes FET capacitors, each of the capacitors of the reference capacitance 444 may also be a FET capacitor with respective gates effectively provided a "0" bit (e.g., coupling the respective gates to ground). In some embodiments of the disclosure, the layout of the circuits for the FET capacitors are similar to reduce deviations between the FET capacitors.

The reference capacitance 445 provides a capacitance to the sense node CT when the data DPH(n−1)B is a high logic level. In some embodiments of the disclosure, when the data DPH(n−1)B is a high logic level, the reference capacitance 445 provides a same capacitance as the minimum capacitance of the adjustable capacitance 442. The reference capacitance 445 may have a similar structure as previous described for the reference capacitance 444.

The DFE circuit 440 may set a reference level for the input buffer circuit 400 based on the output data DPH(n−1) and DPH(n−1)B from the other input buffer circuit. The sense circuit 420 uses the reference level to determine whether voltage for data provided to the external data terminal DQ while the input buffer circuit is activated represents a high logic level (e.g., output data DPHn is a high logic level and DPHnB is a low logic level) or a low logic level (e.g., output data DPHn is a low logic level and DPHnB is a high logic level).

In some embodiments of the disclosure, the DFE circuit 440 sets the reference level to a first reference level or a second reference level based on the output data DPH(n−1) and DPH(n−1)B from the other input buffer circuit. For example, the DFE circuit 440 may set the reference level of the input buffer circuit 400 to high reference level that is effectively higher than a reference level of the VrefDQ voltage or to a low reference level that is effectively lower than a reference level of the VrefDQ voltage based on the output data DPH(n−1) and DPH(n−1)B.

The level of the first and second reference levels may be set by the DFE code Code_T<N:0>. The levels of the first and second reference levels may be relative to the VrefDQ voltage. For example, a high reference level may be greater than the VrefDQ voltage by an amount and a low reference level may be less than the VrefDQ voltage by the amount. The amount of deviation of the high and low reference levels from the VrefDQ voltage may be set by the Code_T<N:0> code. For example, a first value of the Code_T<N:0> results in high and low reference levels having a first amount of deviation relative to the VrefDQ voltage. A second value of the Code_T<N:0> results in high and low reference levels having a second amount of deviation relative to the VrefDQ voltage different from the first amount. Changing a value of the Code_T<N:0> code changes the levels of the first and second reference levels.

As previously described, in some embodiments of the disclosure, the range of adjustment for the reference level is between the minimum value and the maximum value for the Code_T<N:0> code (e.g., between Code_T<N:0>=all "0" and Code_T<N:0>=all "1"). For Code_T<N:0>=all "0," the reference level may be the same as the VrefDQ voltage. For Code_T<N:0>=all "1," the reference level may be changed by a maximum amount relative to the VrefDQ voltage.

Changing the Code_T<N:0> code causes a stepwise increase/decrease of the reference level. For example, changing the Code_T<N:0> from "001" to "010" causes a stepwise change of the reference level. In some embodiments of the disclosure, the amount of the stepwise increase/decrease of the reference level may be based on the capacitance of an adjustable capacitance providing capacitance to one sense node (e.g., sense node CN or CT) relative to the capacitance of a reference capacitance providing capacitance to the other sense node (e.g., sense node CT or CN).

Providing a capacitance to a node that is opposite of a node to which an adjustable capacitance is provided (e.g., for adjusting a reference level of an input buffer circuit) provides greater flexibility to setting the amount of stepwise change of the reference level when the capacitance of the adjustable capacitance is changed by a minimum amount. For example, where a capacitor formed with a minimum feature size nonetheless provides a capacitance that results in too large of a stepwise change of the reference level, providing capacitance to an opposite node of the input buffer circuit may reduce the amount of the stepwise change. In some embodiments of the disclosure, the capacitance provided by a reference capacitance, such as reference capacitance 444 and 445 for the input buffer circuit 400 of FIG. 4, may be used to provide such a capacitance.

An example operation of the input buffer circuit 400 will be described for (1) the DPH(n−1) data is a high logic level and (2) the DPH(n−1) data is a low logic level. It is assumed the voltage provided to the external terminal DQ at the time the input buffer circuit 400 is activated by an active PHn clock is less than the VrefDQ voltage and also less than a low reference level set by the DFE circuit 440. The low reference level is less than a high reference level. In the example operation the input circuit 422 includes low Vt p-channel transistors. The DFE code Code_T<N:0> sets a capacitance provided by the adjustable capacitances 442 and 443 that is greater than the capacitance provided by the reference capacitances 444 and 445.

When the DPH(n−1) data is a high logic level (and the DPH(n−1)B data is a low logic level), the adjustable capacitance 443 provdes capacitance to the node CT and the reference capacitance 444 provides capacitance to the sense node CN. As a result, the sense node CT has a greater capacitive load than the sense node CN, which causes a voltage of the sense node CT to change more slowly than a voltage of the sense node CN. The greater capacitive load on sense node CT has the effect of increasing the reference level of the input buffer circuit 400 to greater than the VrefDQ voltage (e.g., to a high reference level).

The activation circuit 421 provides power when the PHn clock is active, which causes the p-channel transistors of the input circuit 422 to be conductive and provide power to the sense nodes CN and CT, respectively. A voltage provided to the first transistor coupled to the external data terminal DQ is less than the VrefDQ voltage provided to the second transistor, which causes the first transistor to be more conductive than the second transistor. As a result, the voltage of the sense node CN increases from the precharge voltage (e.g., ground) more quickly than the voltage of the sense node CT. The additional influence of the greater capacitive load on the sense node CT further contributes to the higher rate at which the voltage of sense node CN changes compared to the sense node CT. With the voltage of the sense node CN increasing more quickly than the voltage of the sense node CT, the first transistor of the output circuit 424 becomes more conductive than the second transistor of the output circuit 424. The conductive first transistor causes the first output of the latch circuit 430 (at which the DPHn data is provided) to decrease from a precharge voltage (e.g., vdd2) to a low logic level voltage (e.g., ground). The decreasing voltage causes the latch circuit 430 to latch and provide low logic level DPHn data and high logic level DPHnB data.

When the DPH(n−1) data is a low logic level (and the DPH(n−1)B data is a high logic level), the adjustable capacitance 442 provides capacitance to the sense node CN and the reference capacitance 445 provides capacitance to the sense node CT. As a result, the sense node CN has a greater capacitive load than the sense node CT, which causes a voltage of the sense node CN to change more slowly than a voltage of the sense node CT. The greater capacitive load on sense node CN has the effect of decreasing the reference level of the input buffer circuit 400 to less than the VrefDQ voltage (e.g., to a low reference level).

The activation circuit 421 provides power when the PHn clock is active, which causes the p-channel transistors of the input circuit 422 to be conductive and provide power to the sense nodes CN and CT, respectively. A voltage provided to the first transistor coupled to the external data terminal DQ is less than the VrefDQ voltage provided to the second transistor, which causes the first transistor to be more conductive than the second transistor. As a result, the voltage of the sense node CN increases from the low precharge voltage. The additional influence of the greater capacitive load on the sense node CN reduces the rate at which the voltage of sense node CN changes compared to the sense node CT (to which the reference capacitance is provided). However, with the voltage provided to the first transistor also less than the low reference level, as previously described, the voltage of the sense node CN nonetheless increases more quickly than the voltage of the sense node CT. The voltage of the sense node CN causes the first transistor of the output circuit to become more conductive than the second transistor of the output circuit 424. The conductive first transistor causes the first output of the latch circuit 430 to decrease from the high precharge voltage to a low logic level voltage (e.g., ground). The decreasing voltage causes the latch circuit 430 to latch and provide low logic level DPHn data and high logic level DPHnB data.

As illustrated by the previously described example of operation, the DFE circuit 440 sets a reference level for the input buffer circuit 400 that is used to determine whether a voltage provided to the external data terminal DQ at the time the input buffer circuit 400 is activated is sensed and provided as a high logic level (e.g., high logic level DPHn data and low logic level DPHnB data) or a low logic level (e.g., low logic level DPHn data). Additionally, the DFE circuit 440 includes adjustable capacitances 442 and 443 and includes reference capacitances 444 and 445. As previously described, an amount of stepwise change of the reference level for a change in the value of the DFE code Code_T<N: 0> may be based on the adjustable capacitance provided to one node and the reference capacitance provided to the other node. By including the reference capacitances 444 and 445, the amount of stepwise change of the reference level for the input buffer circuit 400 may be less than compared to a DFE circuit that does not include reference capacitances. Thus, greater flexibility in setting an amount of stepwise change in reference level is provided by a DFE circuit including adjustable capacitances and reference capacitances providing respective capacitances to opposite nodes.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An input buffer circuit, comprising:
   a sense circuit configured to compare a voltage of input data with a reference voltage and provide first and second voltages to first and second sense nodes, respectively, based on the comparison;
   a latch circuit coupled to the sense circuit and configured to latch and provide output data having logic levels based on the first and second voltages; and
   a decision feedback equalizer coupled to the first and second sense nodes and configured to concurrently provide a first capacitance to the first sense node and a second capacitance to the second sense node to set the reference voltage of the input buffer circuit,
   wherein the first capacitance and the second capacitance are based on voltages from another input buffer circuit.

2. The input buffer circuit of claim 1,
   wherein the voltages from the other input buffer circuit includes a third voltage and a fourth voltage, wherein the first capacitance comprises a first adjustable capacitance configured to receive the third voltage and further configured to provide at least a portion of the first capacitance responsive to a logic high level of the third voltage, and wherein the second capacitance comprises a second adjustable capacitance configured to receive the fourth voltage and further configured to provide at least a portion of the second capacitance responsive to a logic high level of the fourth voltage.

3. The input buffer circuit of claim 2, wherein the first adjustable capacitance includes a plurality of capacitors, the plurality of capacitors are configured to provide a plurality of corresponding different capacitances.

4. The input buffer circuit of claim 3, wherein the first adjustable capacitance is configured to receive a code and configured to adjust the at least a portion of the first capacitance responsive to the code.

5. The input buffer circuit of claim 4, wherein the code comprises a plurality of bits, and wherein each capacitor of the plurality of capacitors is provided a respective bit of the plurality of bits.

6. The input buffer circuit of claim 5, wherein the plurality of capacitors are configured to provide different capacitances.

7. The input buffer circuit of claim 6, wherein the capacitances of the capacitors are binary weighted.

8. The input buffer circuit of claim 2, wherein the first capacitance comprises a first reference capacitance configured to receive the fourth voltage and further configured to provide at least a portion of first capacitance responsive to the logic high level of the fourth voltage, and wherein the second capacitance comprises a second reference capacitance configured to receive the third voltage and further configured to provide at least a portion of the second capacitance responsive to the logic high level of the third voltage.

9. The input buffer circuit of claim 8, wherein the at least a portion of the first capacitance is a minimum capacitance of the second adjustable.

10. An apparatus, comprising:
a first input buffer circuit configured to receive input data and further configured to provide first output data; and
a second input buffer circuit configured to receive the input data and further configured to provide second output data,
wherein each input buffer circuit of the first and second input buffer circuits comprises:
a sense circuit configured to receive the input data, configured to compare a voltage of the input data with a reference voltage and provide first and second voltages to first and second sense nodes, respectively, based on the comparison;
a decision feedback equalizer coupled to the first and second sense nodes and configured to concurrently provide first and second capacitances to the first and second sense nodes; and
a latch circuit coupled to the sense circuit and configured to latch and provide output data having logic levels based on the first and second voltages,
wherein the output data provided by the latch circuit of the first input buffer circuit is the first output data and the output data provided by the latch circuit of the second input buffer circuit is the second output data, and wherein the decision feedback back equalizer of the second input buffer circuit is configured to provide the first and second capacitances responsive to the first output data.

11. The apparatus of claim 10, wherein the sense circuit is further configured to receive a clock, wherein the sense circuit is configured to configured to compare a voltage of the input data with a reference voltage and provide first and second voltages to first and second sense nodes responsive to the clock.

12. The apparatus of claim 11, wherein the clock received by the sense circuit in the first input buffer circuit is a first clock and the clock received by the sense circuit in the second input buffer circuit is a second clock, wherein the first clock has a phase earlier than a phase of the second clock.

13. A method, comprising:
receiving first input data;
providing first output data responsive to the input data;
receiving second input data;
comparing a voltage of the second input data with a reference voltage;
providing first and second voltages to first and second sense nodes, respectively, based on the comparison;
providing first and second capacitances to the first and second sense nodes based on the first output data to set the reference voltage; and
latching and providing second output data having logic levels based on the first and second voltages.

14. The method of claim 13, further comprising receiving first and second clocks of multiphase clock signals, wherein providing the first output data is responsive to the first clock, wherein providing the second output data is responsive to the second clock, and wherein the first clock has a phase earlier than a phase of the second clock.

15. The method of claim 13, further comprising:
receiving third and fourth voltages based on the first output data, and wherein providing the first capacitance comprises providing at least a portion of the first capacitance by a first adjustable capacitance responsive to a logic high level of the third voltage, and wherein providing the second capacitance comprises providing at least a portion of the second capacitance by a second adjustable capacitance responsive to a logic high level of the fourth voltage.

16. The method of claim 15, further comprising:
receiving a code; and
adjusting at least the portion of the first capacitance responsive to the code prior to providing at least a portion of the first capacitance.

17. The method of claim 16, wherein adjusting at least the portion of the first capacitance comprises selecting capacitors of a plurality of capacitors in the first adjustable capacitance, wherein the plurality of capacitors have different capacitances from one another.

18. The method of claim 17, wherein the plurality of capacitors have the capacitances that are binary weighted.

19. The method of claim 15, further comprising:
providing at least a portion of the first capacitance by a first reference capacitance responsive to the logic high level of the fourth voltage; and providing at least a portion of the second capacitance by a second reference capacitance responsive to the logic high level of the third voltage.

20. The method of claim 19, wherein the at least a portion of the first capacitance is a minimum capacitance of the second adjustable capacitance.

* * * * *